(12) United States Patent
Ho

(10) Patent No.: US 6,197,614 B1
(45) Date of Patent: Mar. 6, 2001

(54) QUICK TURN AROUND FABRICATION PROCESS FOR PACKAGING SUBSTRATES AND HIGH DENSITY CARDS

(75) Inventor: Chung W. Ho, Monte Sereno, CA (US)

(73) Assignee: Thin Film Module, Inc., Taoyuan Hsien (TW)

( * ) Notice: Subject to any disclaimer, the term of this patent is extended or adjusted under 35 U.S.C. 154(b) by 0 days.

(21) Appl. No.: 09/467,120

(22) Filed: Dec. 20, 1999

(51) Int. Cl.[7] .................................................. H01L 21/44
(52) U.S. Cl. ........................ 438/108; 361/762; 257/691
(58) Field of Search .................................. 438/107, 108, 438/118, 122, 706, 622, 125; 257/701, 758, 691; 361/762; 174/252, 256

(56) References Cited

U.S. PATENT DOCUMENTS

| | | | |
|---|---|---|---|
| 5,220,489 | * 6/1993 | Barreto et al. | 361/400 |
| 5,485,038 | 1/1996 | Licari et al. | 257/758 |
| 5,505,320 | 4/1996 | Burns et al. | 216/13 |
| 5,509,553 | 4/1996 | Hunter, Jr. et al. | 216/13 |
| 5,525,834 | 6/1996 | Fischer et al. | 257/691 |
| 5,724,232 | * 3/1998 | Bhatt et al. | 361/762 |
| 5,804,422 | * 9/1998 | Shimizu et al. | 438/125 |
| 5,830,563 | 11/1998 | Shimoto et al. | 428/209 |
| 5,837,427 | 11/1998 | Hwang et al. | 430/312 |
| 5,877,551 | 3/1999 | Tostado et al. | 257/701 |
| 5,895,581 | 4/1999 | Grunwald | 216/13 |

* cited by examiner

*Primary Examiner*—Matthew Smith
*Assistant Examiner*—Calvin Lee
(74) *Attorney, Agent, or Firm*—George O. Saile; Stephen B. Ackerman

(57) ABSTRACT

A new method is provided for packaging high-density IC semiconductor devices. A metal substrate is provided, a layer of dielectric is deposited over the first surface of the metal panel. One or more interconnect layers are then created on top of the dielectric layer, the interconnect layers, which can be thin film interconnect layers, are patterned using maskless exposure equipment. One or more cavities are created in the second surface of the metal panel; openings through the layer of dielectric are created where the layer of dielectric is exposed in the openings in the metal substrate thereby providing points of electrical contact to the second surface of the interconnect substrate. Holes are created in the first surface of the interconnect substrate thereby providing points of electrical contact to the first surface of the interconnect substrate. Bare semiconductor devices and/or packaged semiconductor devices can be attached on one or both sides of the interconnect substrate. Connector pads on the first surface of the interconnect substrate can be used to insert the substrate into a connector socket.

19 Claims, 2 Drawing Sheets

QUICK TURN AROUND FABRICATION PROCESS FOR PACKAGING SUBSTRATES AND HIGH DENSITY CARDS

This application is related to Attorney Dockets #TFM99-001 filed on Jun. 14, 1999, Ser. No. 09/332428, #TFM99-002 filed on Jun. 14, 1999, Ser. No. 09/332427, #TFM99-003 filed on Sep. 3, 1999, Ser. No. 09/389634, #TFM99-004 filed on Nov. 1, 1999, Ser. No. 09/431138 and #TFM99-005 filed on Dec. 28, 1999, Ser. No. 09/473034, assigned to a common assignee.

BACKGROUND OF THE INVENTION (1) Field of the Invention

The invention relates to the fabrication of integrated circuit devices, and more particularly, to a method of creating packaging substrates and high density cards for the packaging of high density semiconductor devices. The method of the invention allows for the production of packaging substrates in a mix of large and small quantities.

(2) Description of the Prior Art

Printed Circuit Boards (PCB's) are being used extensively in the creation of large semiconductor functional units. The PCB serves a number of different functions when used to mount semiconductor devices such as providing mechanical or structural support for the semiconductor devices, the ability to fan out the input/output (I/O) terminals, the ability to reduce thermal constraints that otherwise would be imposed on the semiconductor device. To enable the mounting of semiconductor devices on the surface of a PCB, different device packages have been developed. Among these different packages, the Pin Grid Array (PGA) and the Ball Grid Array (BGA) package are frequently used.

Quad Flat Packages (QFP) have in the past been used to create surface mounted low to medium pin count integrated packages with various pin configurations. The electrical connections with these packages are typically established by closely spaced leads that are distributed along the four edges of the flat package. This limits the usefulness of the QFP since a high Input/Output (I/O) count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Increased I/O count combined with increased requirements for high performance IC's has led to the development of Flip Chip packages. Flip chip technology fabricates bumps (typically Pb/Sn solder) on Al pads and interconnects the bumps directly to the package media, which are usually ceramic or plastic based. The flip-chip is bonded face down to the package through the shortest paths. These technologies can be applied not only to single-chip packaging, but also to higher or integrated levels of packaging in, which the packages are larger, and to more sophisticated package media that accommodate several chips to form larger functional units. Flip chip attachment consists of attaching a flip chip to a printed circuit board or other substrate. A flip chip is a semiconductor chip that has a pattern or arrays of terminals spaced around an active surface of the flip chip for face down mounting of the flip chip to a substrate. The flip chip is bonded to the printed circuit board by refluxing the solder balls. The solder balls may also be replaced with a conductive polymer.

The flip-chip technique, using an area array, has the advantage of achieving the highest density of interconnection to the device and a very low inductance interconnection to the package. However, pre-testability, post-bonding visual inspection, and Temperature Coefficient of Expansion (TCE) matching to avoid solder bump fatigue are still challenges. In mounting several packages together, such as surface mounting a ceramic package to a plastic board, the TCE mismatch can cause a large thermal stress on the solder lead joints that can lead to joint breakage caused by solder fatigue from temperature cycling operations.

In packaging ball grid array and flip-chip semiconductor devices, these devices are mounted on the surface of a package substrate; the package substrate typically is a Printed Circuit Board. The contact points of the BGA/flip-chip make contact with contact points in the top surface of the substrate, the substrate re-distributes (fan-out) the BGA/flip-chip contact points. The lower surface of the substrate has the contact points (balls) that are connected to the surrounding circuitry and that form the interface between the BGA/flip-chip contact balls and this surrounding circuitry. The original contact balls of the BGA/flip chip packages are encased in a molding material (for instance epoxy) for protection of these balls. The molding is encased between the lower surface of the BGA/flip-chip device and the upper surface of the substrate. This molding is referred to as underfill since it is filled in under the original BGA/flip-chip device.

In PCB manufacturing, multiple layers of printed circuits are created inside the printed circuit board. These layers are superimposed and are electrically isolated from each other. The printed circuits that make up the various layers of the PCB establish the electrical interconnections between the semiconductor devices and the surrounding circuitry.

Prior Art substrate packaging uses ceramic and plastic Ball Grid Array (BGA) packaging. Ceramic substrate packaging is expensive and has proven to limit the performance of the overall package. Recent years have seen the emergence of plastic substrate BGA packaging; this type of packaging has become the mainstream design and is frequently used in high volume BGA package fabrication. The plastic substrate BGA package performs satisfactorily when used for low-density flip chip Integrated Circuits (IC's). If the number of pins emanating from the IC is high, that is in excess of 350 pins, or if the number of pins coming from the IC is less than 350 but the required overall package size is small (resulting in a solder ball pitch of less than 1.27 mm.), the plastic BGA structure becomes complicated and expensive. This can be traced to the multi-layer structure used to create the plastic BGA package. This multi-layer structure for the plastic BGA interconnect package is referred to as the Build Up Multilayer or BUM approach and results in a line density within the package of typically 2–3 mil or 50u–75u range. This line density is not sufficiently high for realizing the fan out from the chip I/O to the solder balls on the package within a single layer. This leads to the multi-layer approach. The multi-layer approach brings with it the use of relatively thick (50u–75u) dielectric layers, these layers have a TCE (Thermal Coefficient of Expansion) that is considerably higher than the TCE of the laminate board on which the plastic BGA package is mounted. To counteract this difference in TCE's the BUM layers must be (thermally and mechanically) balanced on the other side (the side of the board that does not usually require an interconnect density provided by the BUM layers) of the laminate board. This latter requirement results in the use of additional material and processing steps to apply these materials, increasing the cost of the BGA package and creating a yield detractor.

Another approach is the use of a flexible film as the starting material. A polymer film, such as the polyimide film or an epoxy based film of 2 to 3 mil thick with or without a copper layer attached to it, is processed by metalization and patterning on one or both sides. A completed two metal layer film, described as a layer pair, can be used as a packaging substrate material. Subsequent dielectric and copper layers can be build up on the processed first metal layer, such as the RCC (Resin Coated Copper) approach. Alternatively, two or more layer pairs can be bonded together to make a multilayer structure. The advantage of this approach is that it uses a minimum amount of material. However, because of the lack of stability of the film, the line and space density is limited to that of the BUM structure described herein, which is not sufficiently high for the high density packaging that is used to achieve a low cost substrate, having only a few interconnect layers.

Other Prior Art applications use thin film interconnect layers for flip chip or wire bond packaging substrates. These applications start with a laminate substrate onto which the thin film layers are deposited. For these applications, the laminate substrate is used as a base carrier substrate and provides the mechanical support. Plated Through Holes (PTH) are mechanically drilled through the laminate substrate and are used to establish connections to the backside of the substrate for solder ball attach and electrical contacts. By using thin films, high wire density and very thin dielectric layers can be realized. This approach also does not, unlike the BUM approach, require to counter-balance thick layers of dielectric in order to establish dimensional stability. A disadvantage of the laminate substrate is that the process of mechanically drilling holes through the laminate substrate is time-consuming thereby adding cost to the process. Further, the planarity of the laminate substrate does not meet planarity requirements for the deposition of thin films. Good planarity for the surface of the laminate substrate is established by depositing dielectrics and metal layers on the initial surface of the laminate structure to planarize it, steps that again add to the processing cost of the BGA structure. Since the laminate substrate is composed using organic materials, the substrate is not dimensionally stable resulting in warpage and dimensional variations during high temperature processing and wet chemical interactions. This results in additional processing complications and costs.

On this increasingly competitive market place of commercial electronic products, the Original Equipment Manufacturers (OEM's) and the semiconductor manufacturers, who are the customers of the packaging substrate device, are increasingly interested in getting fast turn around time of prototypes from the substrate suppliers for test, characterization and bring up of their own products. In addition, the customers want these prototype devices to be low cost. To make prototype devices with the existing approach, especially when the number of parts that is needed is either not large or is variable, individual mask sets have to be created and a certain minimum number of substrate panels have to be started. The materials used, the steps taken as well as the management and handling of the work in progress all add to the cost and to the time that is required before product delivery.

The invention teaches a novel process for creating packaging substrates with a fast turn around time that are used for high density semiconductor devices. This is especially true for prototype devices. When using thin film depositions and the BUM approach to create high density interconnect wiring, a minimum number of layers must typically be completed in order to achieve the required wiring. This minimum number of layers brings with it a minimum number of processing steps which in turn minimizes the processing lead time for the completion of the wiring. In addition, the invention teaches a novel process where the materials used and the handling and the management of the Work In Process (WIP) are minimized. As a result, the cost is minimized. The invention provides a method that addresses these concerns while at the same time providing a method that can simultaneously create as part of one manufacturing stream a multiplicity of device packages of various dimensions.

U.S. Pat. No. 5,895,581 (Grunwald) teaches the "direct write" quick turn method of the industry to manufacture a conducting pattern on a non-conductive substrate. This method obviates the need for photolithographic tools by teaching a maskless method of making Printed Circuit Boards.

U.S. Pat. No. 5,505,320 (Burns et al.) provides a method for employing laser direct write for providing a quick turn pattern on a substrate. A minimum of two layers of material is provided on a substrate over which a layer of dry imaging polymer is provided. The layer of dry imaging polymer is laser ablated to provide the desired pattern.

U.S. Pat. No. 5,509,553 (Hunter, Jr. et al.) shows a (3) metal layer process (DEMR) (see FIG. 5A) that appears to comprise a) sputter plating base b) plating metal (semi-additive plating), see col. 2.

U.S. Pat. No. 5,830,563 (Shimoto et al.) discloses a laminate substrate with thin films deposited thereon.

U.S. Pat. No. 5,837,427 (Hwang et al.) shows a (4) BUM process for a PCB.

U.S. Pat. No. 5,724,232 (Bhatt et al.) shows a package with a (1) metal substrate.

U.S. Pat. No. 5,525,834 (Fischer et al.) shows a package having a Cu substrate, thin dielectric layers (1–25 um thick) and thin dielectric layers (12 to 75 um), see col. 7 and 8.

U.S. Pat. No. 5,877,551 (Tostado et al.) discloses a package having a metal substrate with (2) dielectric layers formed of polymers, epoxy (3 to 100 um), see col. 4.

U.S. Pat. No. 5,485,038 (Licari et al.) teaches a package using a photo-imagable epoxy dielectric layer.

SUMMARY OF THE INVENTION

A principle objective of the invention is to provide a quick turn around time method for creating high density semiconductor device packages.

Another objective of the invention is to provide a low cost fabrication approach for prototype packaging substrates.

Another objective of the invention is to handle many different part types of substrates with different batch sizes in a most efficient manner.

Another objective of the invention is to reduce performance limitations imposed by Prior Art high-density semiconductor manufacturing packaging techniques.

Another objective of the invention is to eliminate the use of masks in processing the packaging substrates thus reducing the cost and improving the yield and reducing the material handling and throughput time.

Yet another objective of the invention is to provide for high pin fan-out for high density semiconductor devices.

Yet another objective of the invention is to provide a method of packaging high density semiconductor devices by using thin film deposition techniques.

Yet another objective of the invention is to provide a method for minimizing the total processing steps and the total amount of materials that are used thereby maximizing the yield and minimizing the cost.

A still further objective of the invention is to provide a device package that is devoid of warpage and dimensional variations during high temperature or wet chemical processing.

In accordance with the objectives of the invention a new method is provided for creating a package for high density semiconductor devices. The invention starts with a metal panel (also referred to as the metal substrate); a liquid layer of dielectric is deposited over the first surface of the metal panel. One or more metal interconnect layers are then created on top of the dielectric layer. The metal interconnect layers are patterned in succession using maskless exposure equipment to create metal interconnect patterns. A combination of layers of interconnect forms the interconnect substrate.

The interconnect substrate has two surfaces. The surface of the interconnect substrate that is furthest removed from the metal substrate is the first surface of the interconnect substrate. The surface of the interconnect that is in contact with the metal substrate is the second surface of the interconnect substrate.

The metal substrate has two surfaces, the first surface of the metal substrate is the surface on which the interconnect substrate is created. The second surface of the metal substrate is the surface into which openings are etched for electrical access to the interface substrate.

The metal layer within the interconnect substrate that is closest to the first surface of the metal substrate is referred to as the bottom layer, the metal layer within the interconnect substrate that is furthest removed from the first surface of the metal substrate is referred to as the top layer.

One or more cavities are created in the second surface of the metal panel; openings are created through the layer of dielectric where wireable metal pads underneath the dielectric are exposed within the perimeter of the cavities. The wireable metal pads in the first interconnect layer form the points of electrical access to the second surface of the interconnect substrate. In addition, a metal die pad underneath the dielectric is partially or completely exposed to facilitate die attach and heat removal.

Openings are created in the bottom interconnect layer for electrical access to the first surface of the interconnect substrate. After the fabrication of the metal panel is complete, each substrate on the panel is tested. The substrates are singulated from the panel by cutting.

An added advantage of the process of the invention is that the Thermal Coefficient of Expansion (TCE) of the dielectric is higher than the TCE of the metal substrate. The film that is present in the bottom of the cavity is therefore under tension and is stretched taut. This film also absorbs little water (<1%) and is therefore a stable surface that does not sag or otherwise deform.

DESCRIPTION OF THE PREFERRED EMBODIMENTS

Present technology for the creation of fast turn-around packages for packaging Integrated Circuits uses a maskless approach that is applied on a regular board or on a build-up board. Because of the number of interconnect layers that are required and the mechanical steps that are required such as drilling and lamination, this results in a complex and time consuming processing sequence which adds considerably to the packaging cost with limited reduction in processing time and the number of parts that are used. The process of the invention is simpler and therefore shorter in duration, requiring fewer processing steps and therefore reducing the packaging cost when compared with current methods. The novelty of the invention is that it combines the use of the maskless approach (for making interconnect lines including the thin film interconnect lines) with the use of metal panels.

The invention uses the thin film deposition technology, a semiconductor like technology used for the creation of multi chip modules or flat panels. The processes of the invention use maskless exposure equipment to created high speed, fine interconnect line patterns on a large panel and combines this technique with the creation of thin film interconnect layers on the surface of a metal panel.

Figure 1:
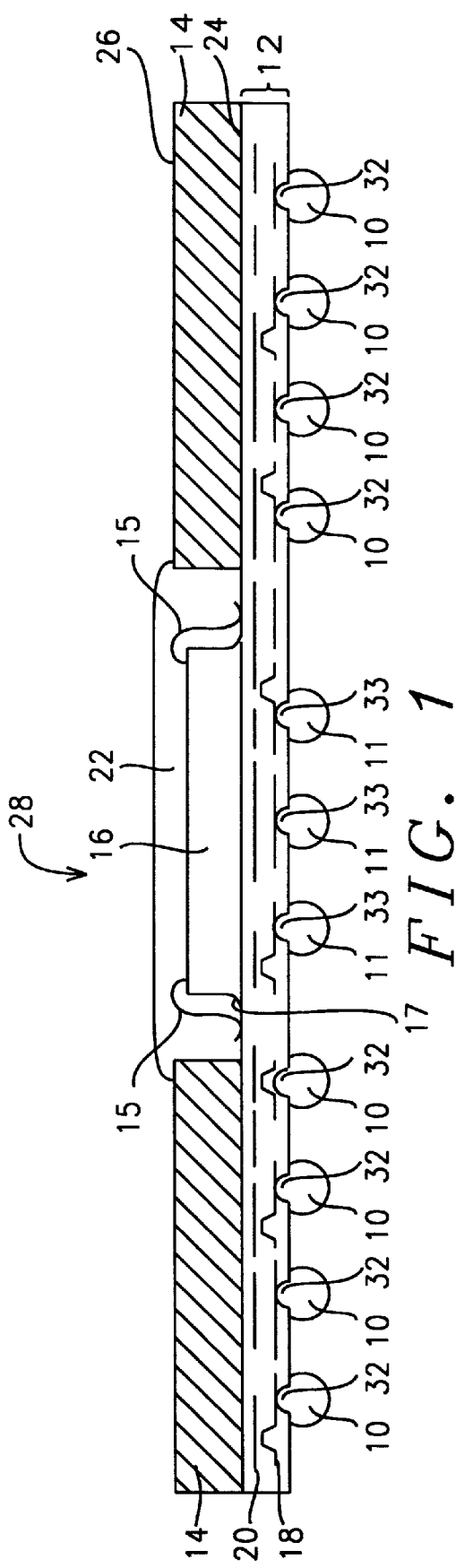
FIG. 1 shows a single chip wire bond chip package with two interconnect layers.

The process of the invention will be described aimed at mounting one semiconductor device within the package of the invention, a cross section of the mounted IC device and the package of the invention is shown in FIG. 1. The process of the invention can, based on the example that is highlighted in FIG. 1, readily be expanded to the mounting of multiple semiconductor devices.

Referring now specifically to FIG. 1, there is shown a cross section of a single IC device whereby two interconnect layers are contained in the interconnect substrate.

The interconnect substrate 12 contains the totality of the sequence of layer s t hat are created within the scope of the invention for making a high density packaging substrate.

The interconnect substrate 12 that has two surfaces. The surface of the interconnect substrate that is furthest removed from the metal-substrate 14 is the first surface of the interconnect substrate. The surface of the interconnect that is in contact with the metal substrate 14 is the second surface of the interconnect substrate.

The metal substrate 14 has two surfaces, the first surface 24 of the metal substrate 14 is the surface on which the interconnect substrate 12 is created. The second surface 26 of the metal substrate is the surface into which openings are etched for electrical access to the interface substrate 12.

The metal layer within the interconnect substrate 12 that is closest to the first surface 24 of the metal substrate 14 is referred to as the bottom layer, the metal layer within the interconnect substrate 12 that is furthest removed from the first surface 24 of the metal substrate 14 is referred to as the top layer.

The two interconnect layers within the interconnect substrate 12 are highlighted as 18, (which can be a ground or power layer) and 20 (which can be a signal layer). Metal substrate 14, typically copper, is between about 30 to 40 mils thick. The metal used for substrate 14 is not limited to copper but can be other metals such as aluminum or stainless steel.

The process of creating the package of the invention starts with a large metal panel that contains adequate surface area for the creation of a multiplicity of IC device packages. This large metal substrate is at a given point in the process divided into a number of smaller metal substrates whereby each of these smaller metal substrates is one package of the invention.

The metal substrate is a steel panel of the material 400 series, having a Thermal Coefficient of Expansion (TCE) of about 6.1 ppm degrees C.

It must be noted from FIG. 1 that the metal substrate 14 and the contact balls 10 are mounted on opposite sites of the interconnect substrate 12 while the metal substrate 14 and the contact balls 10 are also aligned with each other (the metal substrate 14 is located above the contact balls 10). It must further be noted from FIG. 1 that additional contact balls 11 are provided for connections to the interconnect substrate 12, these contact balls 11 are located directly underneath the IC chip 16. The IC chip 16 is mounted in an opening 28 that has been created in the metal substrate 14. The opening 28 into which the wire bond chip 16 is mounted is a cavity that is created by masking and etching of the second side 26 of the metal substrate 14.

A dielectric layer (not shown) is first deposited over the metal substrate 14 on the first side 24 of the metal substrate 14. This deposition of the dielectric can be done by either lamination or by a coating and curing process. The layer of dielectric typically has a thickness of between 0.5 mils and 3 mils. It a required that the dielectric has a TCE (Thermal Coefficient of Expansion) that is higher than the TCE of the metal substrate. This to assure that, after the metal substrate with the deposited layer of dielectric are cooled down to room temperature, the dielectric film is under tension. The dielectric layer can be epoxy with or without a thin glass reinforcement, a polyimide film or any other build-up dielectric material.

The first step in the creation of the interconnect substrate 12 is the creation of a thin film interconnect metal layer 20 on top of the layer of dielectric.

Figure 2A:
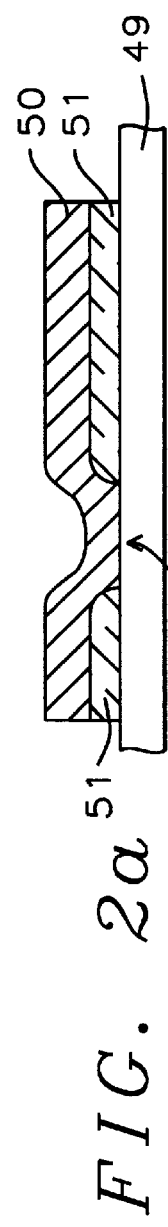
FIGS. 2a–2f shows the processing steps used during the thin film deposition process.
Figure 2B:
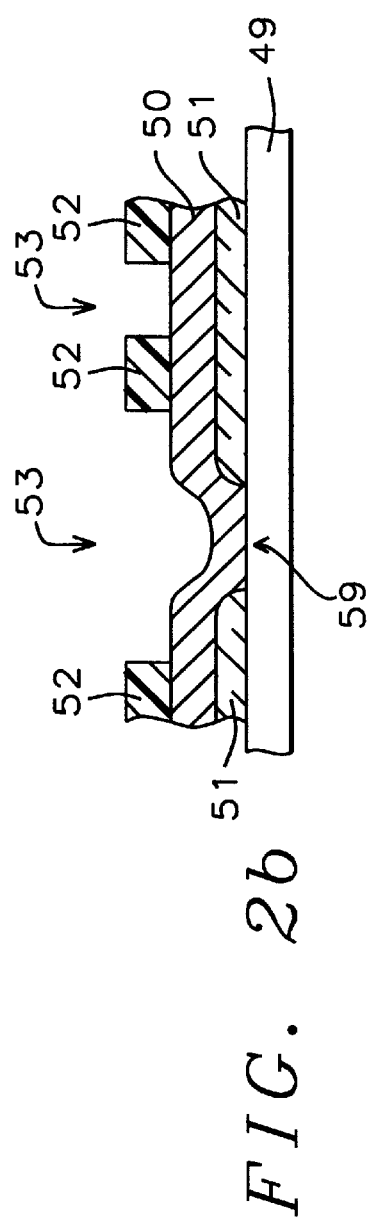
Figure 2C:
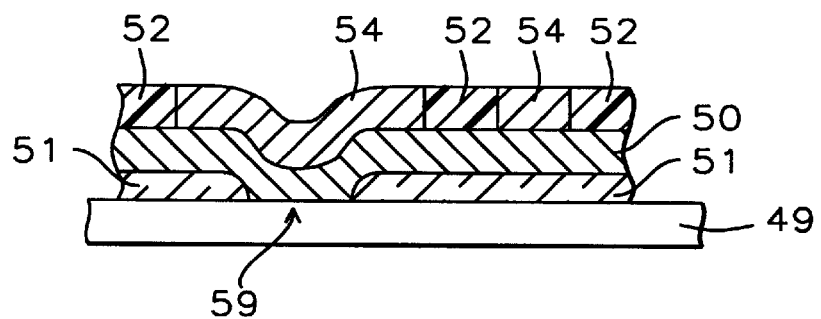
Figure 2D:
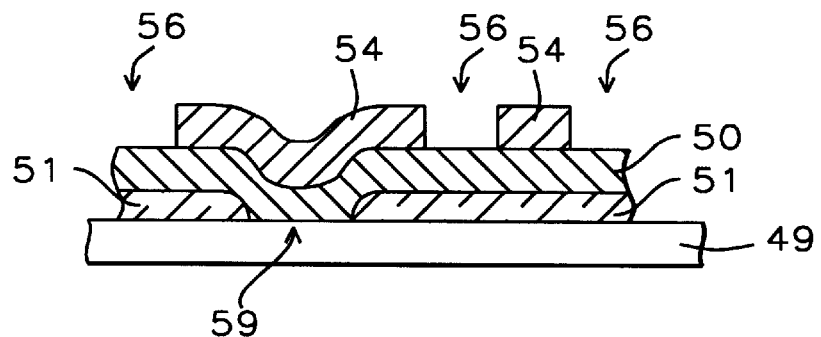
Figure 2E:
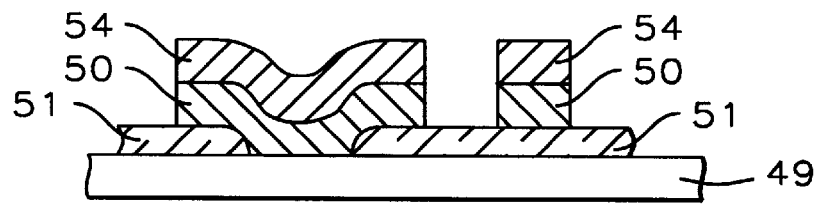
Figure 2F:
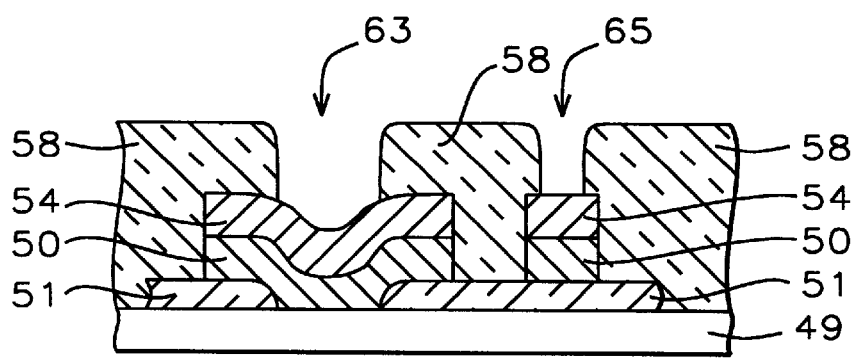

The conventional thin film deposition technique contains the following steps, see FIG. 2:

FIG. 2a, depositing an interconnect plating base 50 by consecutive sputtering of Cr and Cu over a layer of dielectric 51 that has been deposited on the surface 49 of a substrate surface; conventional processing uses expensive sputter and evaporator equipment to deposit the thin layer 50 of metal that serves as the plating base; a via 59 has been created in the layer 51 of dielectric;

FIG. 2b, a layer 52 of photoresist is deposited over the surface of the interconnect plating base 50; this layer 52 of photoresist is masked and patterned creating the pattern 53 of the interconnect lines;

FIG. 2c, semi-additive plating 54 of the interconnect pattern is performed by depositing Cu in the openings that have been created in the layer 52 of photoresist; this plating 54 plates the surface of the (copper) lines that are to be created for the interconnect pattern;

FIG. 2d, removing of the mask 52 (FIG. 2b) of photoresist that has been used as a mask for the semi-additive plating of the interconnect pattern; areas 56 are the regions in the plating base layer 50 that must be removed to create the interconnect pattern;

FIG. 2e, wet etching to remove the sputtered base metal layer 56, FIG. 2d, from between the interconnect pattern 54;

FIG. 2f, coating the created interconnect pattern with a layer 58 of dielectric; vias 63 and 65 have been created in the layer 58 of dielectric for points of electrical contact by either using the photolithographic approach of exposing and developing or by using a laser for applications where wire bond connections need to be made to the interconnect pattern the top dielectric forms a solder mask and vias are created in the dielectric for the solder connections.

It is key to the concept of the invention that the above process is performed while not using any mask during steps of exposure or etching. In this respect it is worthwhile to repeat and to thereby further emphasize the above processing step that relates to FIG. 2b, that is "patterning this layer 52 of photoresist for the step of semi-additive plating of the interconnect pattern using maskless exposure equipment". The invention combines the use of maskless exposure equipment with thin film technology to create thin line patterns on a large panel thereby creating high density interconnect layers. In further combining this thin film interconnect pattern technique with the metal substrate (that is subdivided into independent units by milling or etching) and the etching of openings in one side of the metal substrate for either the insertion of IC devices or for establishing points of electrical contact (to the interface substrate), the invention provides a method of creating high density packages that meets the objectives of the invention. It must thereby also be emphasized that maskless exposure equipment can be programmed to expose one or more patterns in exposing a large surface. This equipment can therefore be used for intermixing patterns across the large panel and it can, in so doing, create patterns of choice across the large surface. These patterns need not be a repetition of previously exposed patterns in the same surface exposure but can contain any desired patterns mix, from repetitive of one pattern to a multiplicity of patterns or any mix and combination thereof. In short: maskless exposure equipment is extremely versatile, a versatility that lends itself well for the creation of patterns of interconnect networks. It is clear that, with the need for masking steps removed, the pattern information that is required by the maskless exposure equipment can be provided in a minimum amount of time to the equipment by either loading a tape or a disk that contains the information for the required pattern. This process therefore is considerably faster than the previous approach that required hard to produce and difficult to manage exposure masks.

It must be pointed out that, where the example of FIG. 1 shows the creation of only one layer of thin film, the invention is not limited to one layer of thin film. A number of thin film layers can be superimposed, dependent on and determined by design packaging requirements. Where limitations arise in the number of overlying layers of thin film that can be applied, these limitations are not limitations that are imposed by the invention but are rather conventional limitations of thin film deposition technology or electrical performance characteristics. The last layer created in this manner, that is the layer 18 in FIG. 1 or the layer furthest removed from the first side 24 of the metal substrate 14, must provide the electrical interconnects between the first surface of the interconnect substrate and the surrounding circuitry and must therefore be coated as a solder mask.

The second side 26 of the metal substrate must next be prepared for providing electrical access to the second surface of the interconnect substrate; an opening or cavity 28 is therefore created in the metal substrate 14 by masking and wet etching of the second side 26 of the metal substrate 14. This step can also be performed using the maskless approach. The size of this opening can vary and depends on the number of electrical contacts that must be established within the perimeter of the opening 28. The wet etch of the second side 26 of the metal substrate exposes the dielectric layer that has previously been deposited (on the first side 24 of the metal substrate 14, see above). The exposed portions of the first layer of dielectric within the openings in the metal substrate can additionally be coated with a layer of adhesive, this after the masking and etching of the second surface of the metal substrate has been completed. The adhesive layer can contain thermally conductive epoxy such as thermoset or thermoplastic epoxy that can withstand temperatures of above about from 150 to 250 degrees C.

The principle of the invention is demonstrated in FIG. 1 by mounting one IC die 16 inside opening 28. It is clear that, although FIG. 1 indicates the mounting of only one IC die 16 inside opening 28, the invention is not limited to one die. By creating a larger opening 28 (or a multiplicity of openings) a multiplicity of IC dies can be inserted into the metal substrate and can, again using wire bond or flip chip connection techniques, be interconnected to the interface substrate.

After the cavity 28 has been created in the second surface 26 of the metal substrate 14 (thereby exposing the layer of dielectric that has been deposited over the first surface 24 of the metal substrate), openings are created in the exposed layer of dielectric through which electrical contact is established with points of contact in the bottom layer 20 of the interconnect substrate 12. One large opening or a matrix of small openings are created in the exposed layer of dielectric on top of a metal die pad onto which the die is to be placed for the die bonding or flip chip mounting and for heat removal purposes. These openings are created using laser technology.

At this point in the process, the metal panel is subdivided or singulated into individual metal panels for individual wire bond packages. Each substrate is electrically tested either before or after the metal panel is subdivided into individual substrates.

An adhesive layer 17 can be provided over the surface of the exposed die pad inside opening 28. The IC chip 16 is inserted into the cavity 28 and electrically connected to the bottom thin film layer of the interconnect substrate. After the IC chip 16 has been inserted into the cavity 28 and the a.electrical connection with the interconnect substrate has been completed, a glob top or over molding (typically using epoxy) 22 is applied over the wire bond chip 16 thereby providing further protection for the die 16.

It is clear that the packaging of the IC die is at this time completed. Electrical contacts have been established by connecting the Ball Grid Array solder balls 10/11 (through the interface substrate 12 and the wire bond connections 15) to the wire bond pads on the IC die 16.

The invention provides a method for mounting IC chips within a metal substrate whereby the IC chips are mounted with its active surface (the surface that contains the points of electrical contact of the chip) facing upwards (for instance wire bonded chips), that is facing away from the above defined interconnect substrate, or downwards (for flip chips). A wire bond chip 16 is connected to the interconnect substrate 12 using wire bonding 15, as indicated. The chip is further brought into close physical contact with the underlying interconnect substrate 12 by means of the adhesive layer 17 that has been applied between the chip 16 and the interconnect substrate 12. The combination of surfaces and substances that surround the IC die 16, that is the adhesive layer 17, the (epoxy) glob top/over molding 22 and the interconnect substrate 12, provide a substantial and direct path of heat flow from the IC die 16 to the metal substrate 14 from where the heat can further be conducted away from the IC die 16 through the solder balls 10 and 11 and into the printed circuit board onto which the package is mounted. Typical thin film dielectric have a thickness between about 0.5 and 1.0 mil and are therefore not a significant inhibitor to heat transfer. Conventional plastic BGA packages use FR4/BT laminates that are several mils thick and have therefore a high resistance to heat transfer. The invention therefore provides a key advantage of significantly improving the cooling the IC devices that are mounted in the package of the invention.

To reiterate the salient points of the invention:

the invention uses a metal panel as the base support for a high density device package the invention uses interconnect technology including thin film technology combined with maskless exposure equipment to create (thin film) layers of metal interconnects on the first surface of the metal panel, the combined layers of thin film interconnect form the interconnect substrate whereby the second surface of the interconnect substrate is adjacent to the first surface of the metal panel openings are created in the second surface of the metal panel for electrical access to the second surface of the interconnect substrate openings are created in the first surface of the interconnect substrate for electrical access to the first surface of the interconnect substrate where required, Ni/Al metallurgy can be used to create metal pads on the first surface of the interconnect substrate allowing the package of the invention to be plugged into a connector socket, and the metal panel is subdivided into individual packaging substrates or interconnect cards.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a package for packaging high density semiconductor devices, comprising the steps of:

providing a metal substrate wherein said metal substrate having a first surface and a second surface;

cleaning said first surface of said metal substrate;

depositing a first layer of dielectric over said first surface of said metal substrate;

depositing an interconnect layer using maskless exposure equipment including plating and wet etch steps over the surface of said layer of dielectric thereby forming a first layer of an interconnect substrate wherein said interconnect substrate having a first and a second surface whereby said second surface of said interconnect substrate essentially abuts to said first surface of said metal substrate;

coating said interconnect layer with a dielectric while further using a laser to create a via pattern through said dielectric thereby providing connections to an overlying interconnect layer;

repeating said deposition of said interconnect layer including said coating said interconnect layer with a dielectric for a multiple layer structure thereby including the creation of via patterns through said dielectric thereby providing connections to an overlying interconnect layer;

coating the last interconnect layer of said interconnect substrate with a dielectric layer as a solder mask;

exposing metal pads within said first surface of said interconnect substrate thereby creating openings for electrical connections;

masking and etching said second surface of said metal substrate thereby creating one or more openings furthermore exposing portions of said dielectric within said openings;

selectively creating openings in said exposed dielectric thereby providing points of electrical access to said second surface of said interconnect substrate;

selectively creating openings in said second surface of said interconnect substrate thereby providing points of electrical access in said second surface of said interconnect substrate; and subdividing said metal substrate into individual IC chip substrates or interconnect cards.

2. The method of claim 1 whereby individual chip substrates or interconnect cards on a given panel substrate can be one of several different designs whereby each design can have a different number of units on said panel substrate as patterned by the maskless exposure unit.

3. The method of claim 1 with the additional step of coating said exposed portions of said first layer of dielectric within said openings in said metal substrate with a layer of adhesive said additional step to be performed after said masking and etching said second surface of said metal substrate.

4. The method of claim 3 wherein said adhesive layer contains thermally conductive epoxy such as thermoset or thermoplastic epoxy that can withstand temperatures in excess of about 150 to 250 degrees C.

5. The method of claim 3 with the additional step of inserting one or more IC chips into said one or more openings in said metal substrate whereby said IC chips overlay said adhesive coating thereby furthermore electrically connecting said IC chips to said points of electrical access to said second surface of said interconnect substrate wherein said additional step to be performed after said additional step of coating said exposed portions of said dielectric within said openings in said metal substrate.

6. The method of claim 5 with the additional step of inserting a molding compound into said openings within said metal substrate whereby said molding compound can be applied either over or under said one or more IC chips.

7. The method of claim 1 with the additional step of inserting and attaching solder balls to said points of electrical access in said first surface of said interconnect substrate.

8. The method of claim 1 wherein said depositing a first layer of dielectric over said first surface is creating a layer of dielectric with a thickness between about 0.5 mils and 3 mils furthermore creating vias in said dielectric thereby creating points of electrical access in said second surface of the interconnect substrate.

9. The method of claim 1 wherein said depositing an interconnect layer is creating a thin film interconnect pattern, comprising the steps of:

depositing an interconnect plating base over a semiconductor surface by a swell and etch step followed by an electroless seeding step of a copper layer;

depositing a layer of photoresist over the surface of said plating base;

masking and patterning using maskless exposure equipment said layer of dielectric in preparation for a semi-additive plating of the interconnect pattern thereby creating exposed portions of the plating base wherein said exposed portions to have the pattern of the interconnect pattern;

depositing semi-additive plating of the interconnect pattern by depositing Cu on said exposed portions of said plating base;

removing said mask of photoresist that has been used for the semi-additive plating of said plating base; wet etching to remove the electroless plating base from between said interconnect pattern thereby creating said interconnect pattern;

coating said created interconnect pattern with a dielectric; and creating vias in said dielectric for electrical connections to an overlying layer.

10. The method of claim 1 wherein said depositing an interconnect layer is creating a thin film interconnect pattern, comprising the steps of:

depositing an interconnect plating base over a semiconductor surface by consecutive sputtering of Cr/Cu;

depositing a layer of dielectric over the surface of said plating base;

masking and patterning using maskless exposure equipment said layer of dielectric in preparation for semi-additive plating of the interconnect pattern thereby exposing the surface of said plating base in accordance with said interconnect pattern;

etching off the thin Cr from said surface of said plating base to expose the Cu layer that is contained within said plating base;

depositing semi-additive plating of said interconnect pattern by depositing Cu only on said exposed surface of said plating base;

removing said mask of dielectric that has been used for said semi-additive plating of said interconnect pattern; wet etching to remove said sputtered plating base from between said interconnect pattern thereby creating said interconnect pattern;

coating said created interconnect pattern with a dielectric; creating vias in said dielectric thereby exposing copper pads for connections to an overlying layer; and performing an additional electroless step or an electrolytic plating step to deposit Ni and Al on said exposed copper pads of said interconnect pattern thereby ensuring a reliable solder connections to an overlying layer.

11. The method of claim 1 with the additional electroless step of depositing a Ni and Al layer on top of the exposed copper in the openings for the metal pads within the first surface of said interconnect substrate to ensure a reliable solder connection to a printed circuit board wherein said additional step to be taken after said exposing the metal pads within said first surface of said interconnect substrate.

12. The method of claim 1 wherein said metal substrate contains an element selected from the group of copper or aluminum or stainless steel.

13. The method of claim 1 wherein said metal substrate is a steel panel of the material 400 series said steel panel having a Thermal Coefficient of Expansion (TCE) of about 6.1 ppm degrees C.

14. The method of claim 1 wherein said metal substrate is less than 40 mills thick and has planar dimensions that are large enough to provide for one or more individual metal substrates.

15. The method of claim 1 whereby the Thermal Coefficient of Expansion of said first layer of dielectric exceeds the Thermal Coefficient of Expansion of said metal substrate by a measurable amount.

16. The method of claim 1 wherein said first layer of dielectric contains an element selected from the group of epoxy with or without thin glass reinforcement or polyimide or a composite dielectric and is deposited to a thickness between about 10 and 50 um using either lamination techniques or coating and curing techniques.

17. The method of claim 1 wherein said masking and etching said second surface of said metal substrate creates one or more openings for the insertion of one or more IC chips.

18. The method of claim 1 wherein said interface substrate contains when proceeding from the side of the interface substrate that is closest to said metal substrate:

one or more thin film interconnect layers deposited over said first layer of dielectric;

a coating of dielectric over the thin film layer that is furthest removed from said metal substrate; and a solder mask thereby creating vias in said coating of dielectric over said thin film layer that is furthest removed from said metal substrate for points of electrical connections.

19. The method of claim 1 whereby said claim is extended to include creating a multiplicity of thin film interconnect layers said thin film interconnect layers to be deposited over said dielectric deposited on said first surface of said metal substrate.

* * * * *